(12) United States Patent
Dumitru et al.

(10) Patent No.: US 11,386,953 B2
(45) Date of Patent: Jul. 12, 2022

(54) MULTIPLE MEMORY STATES DEVICE AND METHOD OF MAKING SAME

(71) Applicant: CYBERSWARM, INC., Ploiesti (RO)

(72) Inventors: Viorel-Georgel Dumitru, Ploiesti (RO); Cristina Besleaga Stan, Bucharest (RO); Alin Velea, Bucharest (RO); Aurelian-Catalin Galca, Magurele (RO)

(73) Assignee: CYBERSWARM, INC., Ploiesti (RO)

( * ) Notice: Subject to any disclaimer, the term of this patent is extended or adjusted under 35 U.S.C. 154(b) by 0 days.

(21) Appl. No.: 16/659,608

(22) Filed: Oct. 22, 2019

(65) Prior Publication Data
US 2020/0126614 A1 Apr. 23, 2020

Related U.S. Application Data

(60) Provisional application No. 62/749,426, filed on Oct. 23, 2018.

(51) Int. Cl.
*G11C 11/56* (2006.01)
*H01L 27/24* (2006.01)
*G11C 13/00* (2006.01)
*H01L 45/00* (2006.01)

(52) U.S. Cl.
CPC ........ *G11C 11/5678* (2013.01); *G11C 13/004* (2013.01); *G11C 13/0004* (2013.01); *H01L 27/2463* (2013.01); *H01L 45/06* (2013.01); *H01L 45/126* (2013.01); *H01L 45/1226* (2013.01); *H01L 45/1233* (2013.01); *H01L 45/144* (2013.01); *H01L 45/1625* (2013.01); *H01L 45/1641* (2013.01); *G11C 2013/005* (2013.01)

(58) Field of Classification Search
CPC . H01L 45/06; H01L 45/1226; H01L 45/1233; H01L 45/126; H01L 45/144; H01L 45/1625; H01L 45/1641; H01L 27/2463; G11C 11/5678; G11C 13/0004; G11C 13/004
See application file for complete search history.

(56) References Cited

U.S. PATENT DOCUMENTS

| | | | |
|---|---|---|---|
| 6,087,674 A | 7/2000 | Ovshinsky et al. | |
| 8,116,115 B2 | 2/2012 | Liu et al. | |
| 10,452,531 B1 * | 10/2019 | Jung | G06F 3/0679 |
| 10,475,993 B1 * | 11/2019 | Slovin | H01L 45/065 |
| 2010/0220520 A1 * | 9/2010 | Hwang | H01L 45/144 365/163 |
| 2011/0149371 A1 * | 6/2011 | Liu | G02F 1/0147 359/288 |
| 2012/0037876 A1 * | 2/2012 | Ho | H01L 45/146 257/2 |
| 2014/0003123 A1 * | 1/2014 | Karpov | H01L 45/1233 365/148 |
| 2018/0033826 A1 * | 2/2018 | Choi | H01L 45/1233 |
| 2019/0267543 A1 * | 8/2019 | Katono | H01L 45/14 |
| 2019/0334083 A1 * | 10/2019 | Wu | H01L 45/144 |

* cited by examiner

*Primary Examiner* — Christine A Enad
(74) *Attorney, Agent, or Firm* — DLA Piper LLP (US)

(57) ABSTRACT

A phase-change material based resistive memory contains a resistive layer and two electrical contacts. After fabrication the memory is subjected to thermal treatment which initiates a transition toward a crystalline state favoring in this way the subsequent obtaining of a large number of resistive memory states.

14 Claims, 2 Drawing Sheets

MULTIPLE MEMORY STATES DEVICE AND METHOD OF MAKING SAME

CROSS REFERENCE OF RELATED APPLICATION

This application claims the benefit of U.S. Provisional Patent Application No. 62/749,426, filed Oct. 23, 2018, which is incorporated by reference in its entirety.

BACKGROUND

Resistive memories are devices that can store information as different resistive states. For increasing memory density and data capacity, it is highly desirable to have a resistive memory with multiple resistive states. Resistive memories with multiple states may be used in many applications like non-volatile solid state memories, programmable logic, pattern recognition, neuromorphic computing, etc.

Among resistive memories with multiple memory states, those based on phase-change materials (PCM) such as chalcogenides are promising. PCM based resistive memories (also referred to as PCM memristors) may exhibit a reversible structural phase change between an amorphous (highly resistive) state and a crystalline (highly conductive) state. The switching between the two states (the amorphous state and the crystalline state) may be achieved by applying pulses (e.g., current pulses, voltage pulses, etc.) with different characteristics. The conductive state may be obtained by applying a longer but lower amplitude pulse which may locally heat the amorphous region and may lead to crystallization, whereas the insulating state may be obtained by applying a shorter but higher amplitude pulse which may lead to local melting and the formation of an amorphous region by rapid quenching. In applications as a resistive memory, the pronounced difference in electrical resistivity of PCM may be used.

To achieve multiple memory states, multiple intermediary resistive states may be needed. An example solution for achieving multiple intermediary resistive states is described in U.S. Pat. No. 8,116,115B2 and references therein. This solution is based on controlling the duration, amplitude and shapes of the pulses (e.g., voltage or current pulses). Another example solution is described in U.S. Pat. No. 6,087,674. This solution is based on building a memory element such that it contains a heterogeneous mixture of a phase-change material and a dielectric material and providing a way to deliver the electrical pulses only to a portion of the memory material volume. However, the existing solutions for achieving the multiple resistive states are either complicated from a fabrication point of view or are difficult to control.

SUMMARY

The present disclosure is directed toward a nonvolatile, resistive memory with multiple resistive states based on PCM and a method of making the same. The resistive memory may include a substrate, a PCM layer and two electrical contacts. In one embodiment, the device may have a planar structure. In another embodiment, the device may have a vertical structure with the two electrical contacts placed below and above the PCM layer. The PCM layer may be deposited by magnetron sputtering in an amorphous, high resistive state and may be subjected to a specific thermal treatment. This thermal treatment may initiate transition of the PCM layer toward the crystalline state. This crystalline state initialization process may enable subsequent obtaining of a large number of intermediate resistive states between the high resistive state and a low resistive state. In one embodiment, the multiple intermediate resistive states may be obtained by applying short pulses (e.g., voltage pulses, current pulses, etc.) with determined amplitude. In another embodiment, the multiple intermediate resistive states may be obtained by applying sweeps (e.g., voltage sweeps) with a certain upper limit. The upper limit of the sweep (e.g., voltage sweep) may be set according to the desired resistance state for the PCM resistor.

DETAILED DESCRIPTION OF THE DRAWINGS

DETAILED DESCRIPTION

As discussed herein, the present disclosure is directed toward a nonvolatile memory with multiple resistive states based on phase-change materials (PCM) such as chalcogenides and a method of making the same.

Figure 1:
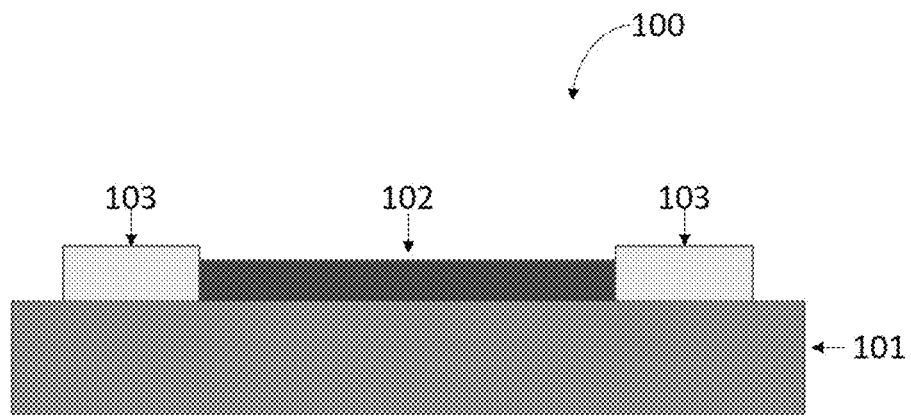
FIG. 1 illustrates a resistive memory structure in accordance with one example.

FIG. 1 shows a cross-sectional view of a PCM resistive memory 100 in accordance with at least one example. The PCM resistive memory 100 may include a substrate 101, a PCM layer 102 and electrical contacts 103. The substrate 101 can be formed from a dielectric material such as glass, high resistivity silicon, silicon carbide, sapphire, high temperature plastic foils, etc. The resistive layer 102 may be formed from a Ge—Te layer. The electrical contacts 103 may be formed by Ti/Au, Al, Mo, ITO, AZO, or any other metallization schema which may be employed for the realization of electrical contacts of PCM memristors. The device may have a planar structure, with the PCM layer 102 and the electrical contacts 103 situated in the same plane, on the surface of the substrate element 101.

Figure 2:
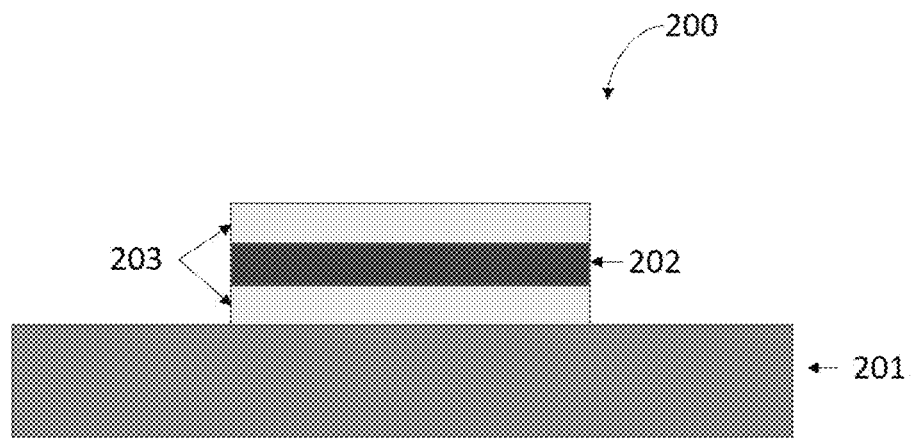
FIG. 2 illustrates a resistive memory structure in accordance with another example.

FIG. 2 shows a cross-sectional view of a PCM resistive memory 200 in accordance with at least one example. The PCM resistive memory 100 may include a substrate 201, a PCM layer 202 and electrical contacts 203. The substrate 201 may be formed from a dielectric material such as glass, high resistivity silicon, silicon carbide, sapphire, high temperature plastic foils, etc. The resistive layer 202 may be formed from a Ge—Te layer. The electrical contacts 203 can be formed by Ti/Au, Al, Mo, ITO, AZO, or any other metallization schema which may be employed for the realization of electrical contacts of PCM memristors. The device may have a vertical structure, with the two contacts 203 placed below and above the PCM layer 202.

For the fabrication of the resistive memory structures presented in FIG. 1 and FIG. 2, standard procedures employed for PCM memristors may be employed. The PCM layer may be deposited by magnetron sputtering. The electrical contacts may be realized by magnetron sputtering, electron-gun evaporation, thermal evaporation or any other deposition method that are usually used in the field. For defining the resistor and the electrical contacts pattern, standard photolithography, electron-beam lithography, mechanical shadow masks or other techniques that are usually used in the field may be employed.

The Ge—Te layer may be deposited by magnetron sputtering in an amorphous, high resistive state. The Ge—Te layer may be subjected to a specific thermal treatment which may initiate its transition toward the crystalline state. The degree of the initiated crystallinity depends on the thermal treatment temperature and influence also the electrical resistivity of the Ge—Te layer. This crystalline state initialization process may enable subsequent obtaining of a large number of intermediate resistive states between the initial high resistive state and a final low resistive state. The optimum temperature of the thermal treatment may be between 190-210 C. By employing this treatment, the electrical resistivity of the layer may change from larger than $1*10^4$ $\Omega$*cm, for the as deposited layer, to $6*10^{-3}$ $\Omega$*cm.

After performing this crystalline state initialization process by subjecting the Ge—Te layer to a thermal treatment in inert atmosphere (Ar) at the optimum temperature, the subsequent obtaining of a large number of intermediate resistive states between the high resistive state and a low resistive state may be realized by different methods. For example in one embodiment, the obtaining of a large number of intermediate resistive states may be realized by applying pulses (e.g., voltage pulses, current pulses, etc.) with different amplitudes.

Figure 3:
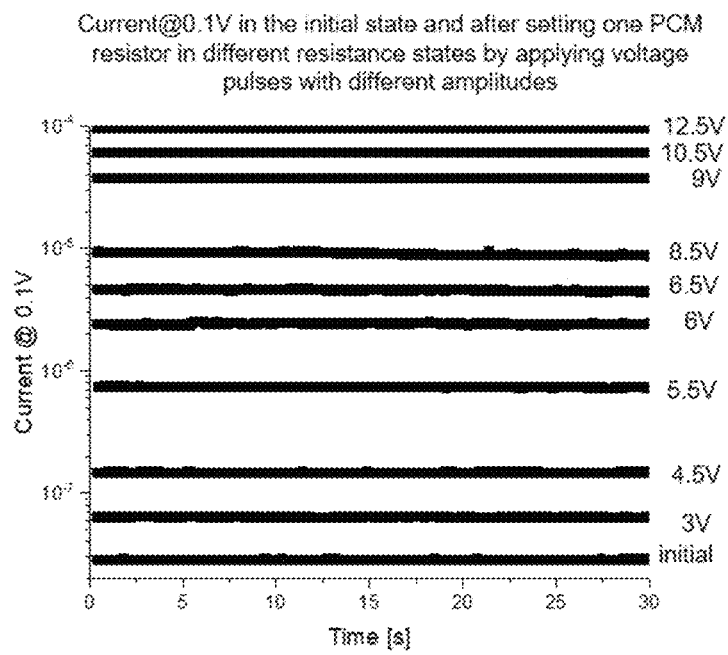
FIG. 3 illustrates a multiple states memory element in accordance with one example.

FIG. 3 shows an example of reading a multiple states PCM planar memory element by measuring the currents flowing through the PCM resistor biased at 0.1V in the initial state and after setting the resistor in different resistance states by applying voltage pulses with different amplitudes.

As shown in FIG. 3, a large number of various resistance states may be obtained.

In an embodiment, the obtaining of a large number of intermediate resistive states between the high resistive state and a low resistive state on a previously thermally treated PCM resistor may be realized by performing sweeps (e.g., voltage sweeps) with different upper limits.

Figure 4:
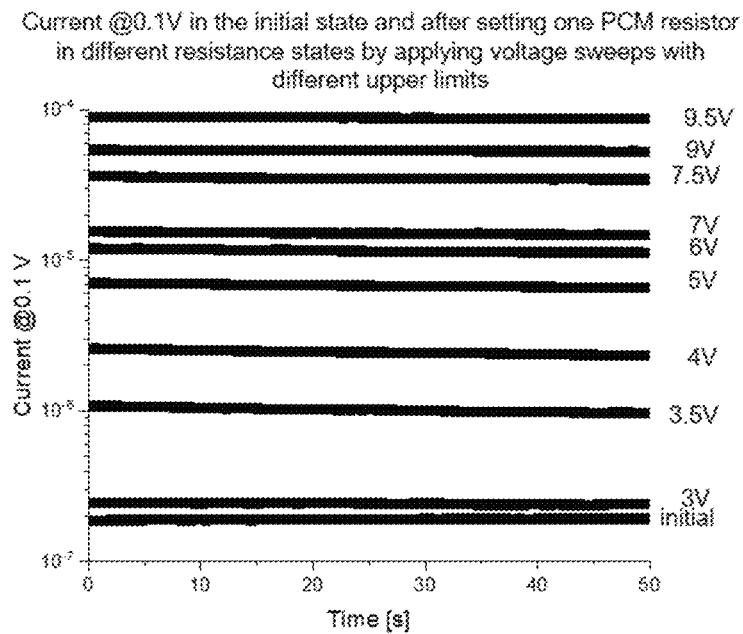
FIG. 4 illustrates a multiple states memory element in accordance with another example.

FIG. 4 shows an example of reading a multiple states PCM planar memory element by measuring the currents flowing through the PCM resistor biased at 0.1V in the initial state and after setting the resistor in different resistance states by performing sweeps (e.g., voltage sweeps) with different upper limits.

As shown in FIG. 4, a large number of various resistance states may be obtained by applying this method.

In one example, the memory elements described in FIG. 3 and FIG. 4 may be employed as a write once, read many times device. Alternatively, the memory element may change resistive state to increase resistance by applying a short but higher amplitude pulse which may lead to local melting toward more of an amorphous state.

The invention claimed is:

1. A phase-change material based resistive memory, comprising:
    a phase-change material (PCM) resistive layer; and
    two electrical contacts, wherein the PCM resistive layer is subjected after fabrication to a specific thermal treatment in an inert atmosphere at a temperature between 190° C.-210° C., which initiates its transition from an amorphous state toward a crystalline state to enable obtaining of a large number of different resistive memory states, the obtaining comprising setting the resistive memory to respective desired resistive states and then applying respective voltage sweeps with different upper voltage limits to the thermally treated PCM resistive layer based on the desired resistive states.

2. The phase-change material based resistive memory of claim 1, wherein the resistive memory has a planar structure with the PCM resistive layer and the two electrical contacts situated in the same plane on the substrate surface.

3. The phase-change material based resistive memory of claim 1, wherein the resistive memory has a vertical structure with the two contacts placed below and above the PCM resistive layer.

4. The phase-change material based resistive memory of claim 1, wherein the PCM resistive layer is a Ge—Te layer and is deposited in the amorphous state.

5. The phase-change material based resistive memory of claim 1, wherein the resistive memory is set to the large number of different resistive states by applying voltage pulses with different amplitudes.

6. The phase-change material based resistive memory of claim 1, wherein the resistive memory is set to the large number of different resistive states by applying the respective voltage sweeps to the PCM resistive layer with the different upper voltage limits.

7. The phase-change material based resistive memory of claim 1, wherein the resistive memory exhibits a reversible structural phase change between the amorphous state and the crystalline state by switching between the two states.

8. A method for obtaining a multiple states resistive memory based on phase-change materials, said method comprising:
    making a deposition of a PCM resistor and two electrical contacts for fabricating the resistive memory;
    annealing the PCM resistor with a specific thermal treatment in an inert atmosphere at a temperature between 190° C.-210° C. after fabrication in order to initiate its transition from an amorphous state toward a crystalline state; and
    obtaining subsequently respective resistive states by setting the resistive memory to respective desired resistive states and then applying certain respective voltage sweeps with different upper voltage limits to the thermally treated PCM resistive layer based on the desired resistive states.

9. The method of claim 8, wherein the certain voltage sweeps are voltage pulses with different amplitudes.

10. The method of claim 8, wherein the respective voltage sweeps are applied to the PCM resistive layer with the different upper voltage limits based on the respective desired resistance states.

11. The method of claim 8, wherein the resistive memory exhibits a reversible structural phase change between the amorphous state and the crystalline state by switching between the two states.

12. The method of claim 8, wherein the resistive memory has a planar structure with the PCM resistor and the two electrical contacts situated in the same plane on the substrate surface.

13. The method of claim 8, wherein the resistive memory has a vertical structure with the two contacts placed below and above the PCM resistor.

14. The method of claim 8, wherein the PCM resistor is indicative of a PCM resistive layer which is a Ge—Te layer and is deposited in the amorphous state.

* * * * *